(12) United States Patent
Lothamer et al.

(10) Patent No.: US 9,897,656 B2
(45) Date of Patent: Feb. 20, 2018

(54) METHOD FOR SENSING WELDED CONTACTS ON A SWITCHING DEVICE

(71) Applicant: Carrier Corporation, Farmington, CT (US)

(72) Inventors: Jeffrey P Lothamer, Ft. Wayne, IN (US); Daniel L Kelly, Ft. Wayne, IN (US)

(73) Assignee: Carrier Corporation, Jupiter, FL (US)

( * ) Notice: Subject to any disclaimer, the term of this patent is extended or adjusted under 35 U.S.C. 154(b) by 34 days.

(21) Appl. No.: 14/266,198

(22) Filed: Apr. 30, 2014

(65) Prior Publication Data

US 2014/0340090 A1 Nov. 20, 2014

Related U.S. Application Data

(60) Provisional application No. 61/823,944, filed on May 16, 2013.

(51) Int. Cl.
| | | |
|---|---|---|
| *G01R 31/02* | (2006.01) |
| *G01R 31/327* | (2006.01) |
| *H01H 1/00* | (2006.01) |
| *H01H 63/00* | (2006.01) |
| *H01H 47/00* | (2006.01) |

(52) U.S. Cl.
CPC ....... *G01R 31/3278* (2013.01); *H01H 47/002* (2013.01); *H01H 1/00* (2013.01); *H01H 63/00* (2013.01); *H01H 2047/003* (2013.01); *H01H 2203/00* (2013.01)

(58) Field of Classification Search
CPC .......... H01H 1/00; H01H 45/00; H01H 63/00; H01H 69/00; H01H 2201/00; H01H 2203/00
See application file for complete search history.

(56) References Cited

U.S. PATENT DOCUMENTS

| | | | | |
|---|---|---|---|---|
| 4,625,191 A | * | 11/1986 | Oberndorfer | .......... H01H 3/001 335/106 |
| 5,277,575 A | | 1/1994 | Newberry | |
| 5,329,781 A | * | 7/1994 | Farrey | ..................... F25D 21/04 62/156 |
| 5,455,733 A | * | 10/1995 | Waggamon | ............ H01H 9/167 307/132 E |
| 5,677,839 A | | 10/1997 | Kondo | |
| 5,748,427 A | | 5/1998 | Yerkovich et al. | |
| 6,137,193 A | | 10/2000 | Kikuoka et al. | |
| 6,262,871 B1 | | 7/2001 | Nemir et al. | |

(Continued)

FOREIGN PATENT DOCUMENTS

| | | |
|---|---|---|
| EP | 1544973 B1 | 6/2005 |
| EP | 2361819 A3 | 8/2011 |

(Continued)

*Primary Examiner* — Jermele M Hollington
*Assistant Examiner* — Temilade Rhodes-Vivour
(74) *Attorney, Agent, or Firm* — Ice Miller LLP

(57) ABSTRACT

A method for sensing a welded relay contact when breaking both sides of a power line on a HVAC device including the steps: applying a first signal to one of a pair of switching devices; electronically sensing a second signal, with a sensing device, whether the other of said two switching devices is welded closed; and sending a third signal from the sensing device indicative of whether the other of said two switching devices is welded closed.

10 Claims, 4 Drawing Sheets

(56) References Cited

U.S. PATENT DOCUMENTS

| | | | |
|---|---|---|---|
| 6,313,636 B1* | 11/2001 | Pohl | H01H 1/0015 324/421 |
| 6,577,024 B2 | 6/2003 | Kikuta et al. | |
| 6,807,035 B1 | 10/2004 | Baldwin et al. | |
| 7,298,148 B2 | 11/2007 | Drake et al. | |
| 7,336,457 B2 | 2/2008 | Liscinsky, III | |
| 7,368,829 B2 | 5/2008 | Tezuka | |
| 7,403,368 B2 | 7/2008 | Johnson, Jr. | |
| 7,407,048 B2 | 8/2008 | Boom | |
| 7,460,808 B2 | 12/2008 | Okada | |
| 7,522,400 B2 | 4/2009 | Laurent et al. | |
| 7,573,150 B2 | 8/2009 | Hirasawa | |
| 7,688,558 B2 | 3/2010 | Bax et al. | |
| 7,964,985 B2 | 6/2011 | Ozaki et al. | |
| 7,966,110 B2 | 6/2011 | Tarchinski | |
| 8,310,159 B2 | 11/2012 | Bigge et al. | |
| 8,344,555 B2 | 1/2013 | Ichikawa et al. | |
| 2006/0198066 A1* | 9/2006 | Chen | H01H 89/08 361/42 |
| 2006/0203402 A1* | 9/2006 | Aromin | H02H 1/0015 361/42 |
| 2007/0029286 A1* | 2/2007 | Kawamura | H01H 47/002 219/50 |
| 2007/0076334 A1* | 4/2007 | Battani | H01H 50/021 361/23 |
| 2008/0008254 A1* | 1/2008 | Lin | H04B 3/54 375/258 |
| 2008/0067876 A1* | 3/2008 | Nitsche | H01H 47/002 307/326 |
| 2008/0158752 A1* | 7/2008 | Hill | H02H 7/30 361/64 |
| 2008/0316004 A1* | 12/2008 | Kiko | H04B 3/56 340/12.34 |
| 2011/0122536 A1* | 5/2011 | Watanabe | B60L 3/0069 361/46 |
| 2011/0163759 A1 | 7/2011 | Ishii et al. | |
| 2011/0274450 A1 | 11/2011 | Atarashi | |
| 2011/0298470 A1* | 12/2011 | Gokhale | H02M 1/32 324/522 |
| 2012/0150382 A1 | 6/2012 | Bucci et al. | |
| 2013/0009598 A1 | 1/2013 | Ohtomo | |

FOREIGN PATENT DOCUMENTS

| | | |
|---|---|---|
| JP | 6237521 A | 8/1994 |
| JP | 8138853 A | 5/1996 |
| JP | 8138854 A | 5/1996 |
| JP | 9185932 A | 7/1997 |
| JP | 11144590 A | 5/1999 |
| JP | 11332188 A | 11/1999 |
| JP | 2000087864 A | 3/2000 |
| JP | 2000173428 A | 6/2000 |
| JP | 2007250240 B2 | 9/2007 |
| JP | 2009168404 A | 7/2009 |
| JP | 2010178454 A | 8/2010 |
| JP | 2010183795 A | 8/2010 |
| JP | 2010225418 A | 10/2010 |
| JP | 2011015567 A | 1/2011 |
| WO | 2012132431 | 4/2012 |
| WO | 2013013763 A1 | 1/2013 |

* cited by examiner

METHOD FOR SENSING WELDED CONTACTS ON A SWITCHING DEVICE

CROSS REFERENCE TO RELATED APPLICATIONS

The present application is related to, and claims the priority benefit of, U.S. Provisional Patent Application Ser. No. 61/823,944 filed May 16, 2013, the contents of which are hereby incorporated in their entirety into the present disclosure.

TECHNICAL FIELD OF THE DISCLOSED EMBODIMENTS

The presently disclosed embodiments generally relate to industrial controls for heating, ventilation and air conditioning (HVAC) equipment, and more particularly, to a method for sensing welded contacts on a switching device.

BACKGROUND OF THE DISCLOSED EMBODIMENTS

Contacts on switching devices, for example electronic relays, can weld together when subjected to high-current resistive or inductive loads. The weld occurs due to the transfer of contact material when the switching device contacts are separating or closing. An electrical arc occurs naturally between the switching device contacts immediately upon separation of the contacts for resistive loads and upon closing of the contacts for inductive loads. This arcing causes material to transfer from one contact to another. Over time, this arcing can cause the switching device contacts to become pitted and eventually weld together. Welding together of the contacts can cause unintended results, such as causing an attached circuit to be unintentionally energized.

To prevent such arcing and welding, some controls are designed with switching devices located on both sides of the incoming load (i.e., on both the power side and the neutral side) instead of just on the power side. By providing this redundancy, a single welded switching device will not cause the circuit to be energized inadvertently. Under this scenario, a single welded contact on a switching device is not detectable since the circuit will continue to function correctly. Furthermore, it requires that the contacts of both switching devices be welded before indicating a failure. There is therefore a need for a method for sensing when a contact on a switching device has welded together in circuits having switching devices on both sides of an incoming load.

SUMMARY OF THE DISCLOSED EMBODIMENTS

In one aspect, a method for sensing a welded closed switching device contact in one of two switching devices in a circuit. The method includes the step of applying a first signal to one of two said switching devices. In one embodiment, the first signal operates to close the one switching device, wherein closing the one switching device causes an annunciation if the other switching device is welded closed.

The method also includes optically sensing whether the other of said two switching device is welded closed. In one embodiment, the method includes sensing the annunciation. In one embodiment, if the sensing device indicates that the other of said two switching devices is welded closed, the method proceeds wherein the first signal is removed from the one switching device.

In another aspect, a method of sensing a welded closed switching device contact in one of two switching devices when breaking both sides of a power line on a HVAC device including a control comprising a microprocessor in electrical communication with a first switching device, a second switching device, and a sensing device, and further including the sensing device in electrical communication with an electrical element is provided. The method includes the step of applying a first signal to one of two said switching devices. In one embodiment, the first signal operates to close the one switching device. In one embodiment, the one switching device may be the first switching device or the second switching device.

The method further includes electronically sensing a second signal with the sensing device whether the other of said two switching devices is welded closed. In one embodiment, the other of said two switching devices may be the first switching device or the second switching device. In one embodiment, the sensing device senses whether the other of said two switching devices may be welded closed by the detecting the second signal produced from the electrical element. The method further includes the sensing device sending a third signal indicative of whether the other of said two switching devices is welded closed. In one embodiment, if it is indicative that the other of said two switching devices is welded closed, the first signal is removed from the one switching device. Optionally, the method may cause displaying of an indication that an output load of the circuit is inoperable. In one embodiment, if it is indicative that the other of said two switching devices is not welded closed, a fourth signal is applied to the other of two said switching devices. In one embodiment, the fourth signal is an electrical signal to close the other of two said switching device.

In another aspect, a method of applying power to a circuit including two switching devices is provided. The method includes the steps of determining that one of the first switching device and second switching device was activated before another of the first switching device and second switching device the last time power was applied to the circuit. In one embodiment, the method further includes applying a first signal to said other of said two switching devices. In one embodiment, the first signal operates to close said other of said two switching devices. In one embodiment, the method further includes electronically sensing with the sensing device whether said one of said two switching devices is welded closed. In one embodiment, the method further includes applying a second signal to said one of said two switching devices. In one embodiment, the second signal operates to close said one of said two switching devices.

DETAILED DESCRIPTION OF THE DISCLOSED EMBODIMENTS

Figure 1:
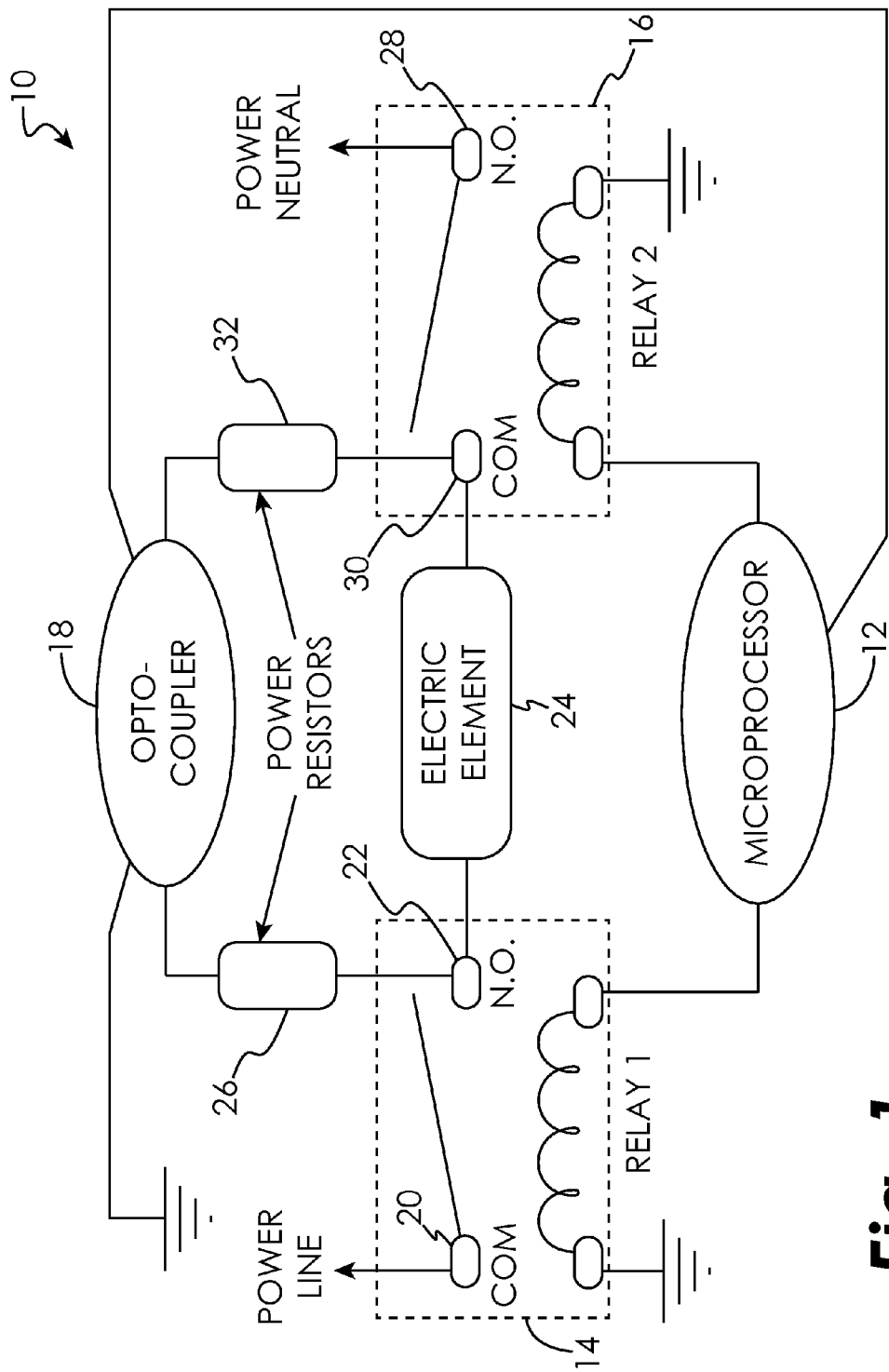
FIG. 1 is a schematic diagram of a circuit in an exemplary embodiment.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 illustrates a schematic diagram of a circuit of an exemplary embodiment of the present disclosure, indicated generally at 10. The circuit 10 includes a microprocessor 12 in electrical communication with a first switching device 14, a second switching device 16, and a sensing device 18. In an exemplary embodiment, the sensing device 18 comprises an optocoupler, to name one non-limiting example. In an exemplary embodiment, the first switching device 14 is a normally open relay including a first device first contact terminal 20 and a first device second contact terminal 22. The first device first contact terminal 20 is in electrical communication with a power line, such as a 220 VAC connection to name one non-limiting example. The first device second contact terminal 22 is in electrical communication with an electric element 24, and a resistor 26. In one embodiment, electric element 24 comprises a light emitting diode (LED) to name one non-limiting example. In an exemplary embodiment, the second switching device 16 is a normally open relay including a second device first contact terminal 28 and a second device second contact terminal 30. The second device first contact terminal 28 is in electrical communication with a power line neutral. The second device second contact terminal 30 is in electrical communication with the electric element 24 and a resistor 32. The sensing device 18 is in electrical communication with resistor 26 and resistor 32.

Figure 2:
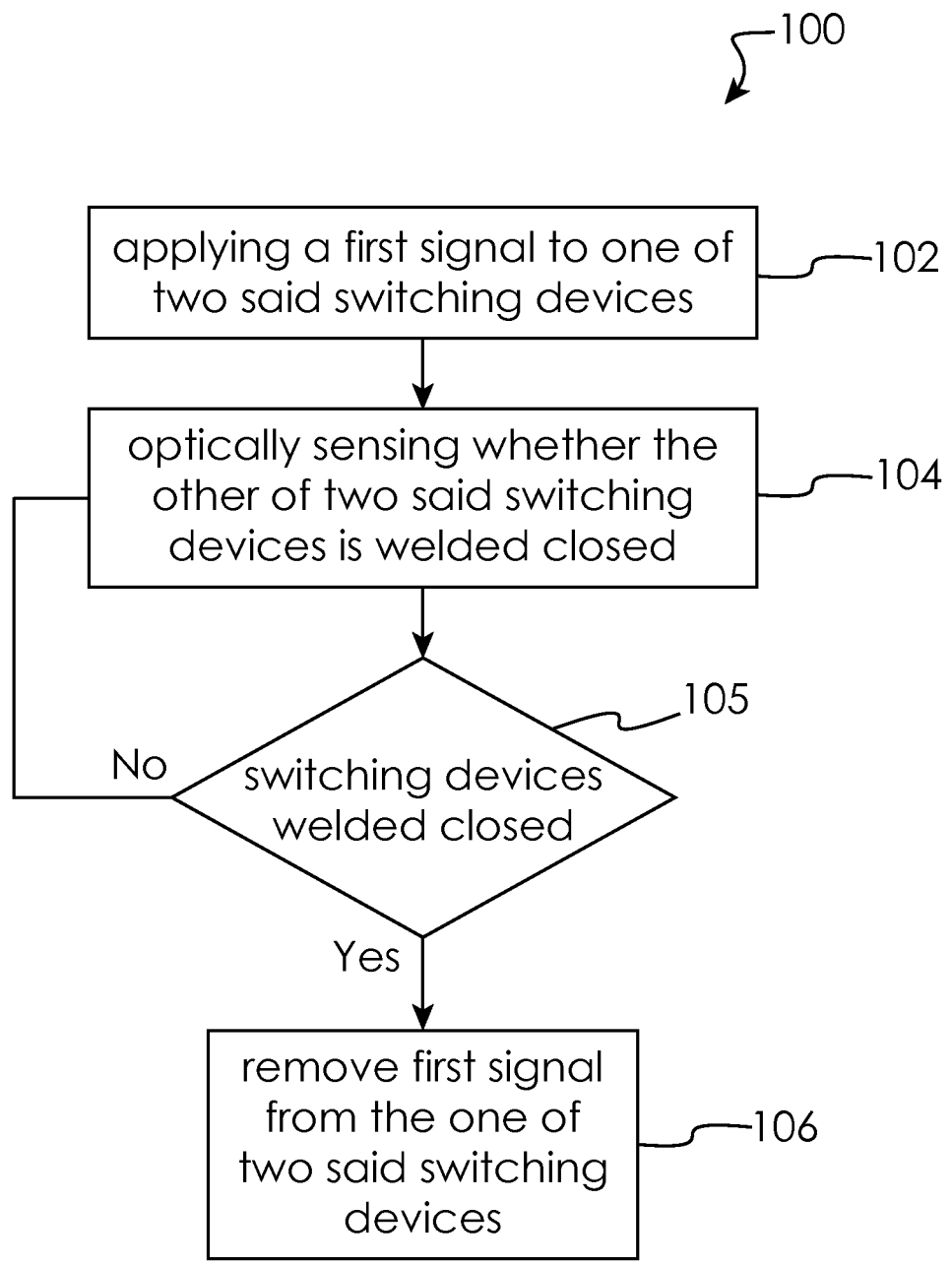
FIG. 2 is a schematic flow chart of an exemplary embodiment method for detecting a welded switching device.

FIG. 2 illustrates an exemplary embodiment of a method for detecting a single welded switching device in the circuit 10 of FIG. 1. As shown in FIG. 2, an exemplary method 100 includes the step 102 of applying a first signal to one of two said switching devices. In one embodiment, the first signal operates to close the one switching device, wherein closing the one switching device causes an annunciation if the other switching device is welded closed. For example, microprocessor 12 sends an electrical signal commanding the first switching device 14 to close.

In one embodiment, step 104 includes electronically sensing whether the other of said two switching devices is welded closed. In one embodiment, the sensing device 18 electronically senses the annunciation produced from the electrical element 24. For example, when the first switching device 14 closes, a voltage is applied to the electric element 24. If the second switching device 16 is also closed, a current will flow through the electric element 24, and the electric element 24 will produce an annunciation, for example illuminating a light emitting diode (LED) to name one non-limiting example. If the second switching device 16 is not closed, the electric element 24 will not produce an annunciation. It will be appreciated that the sequence in which the first signal is applied to the one of two said switching device may be reversed.

In one embodiment, it is decided at step 105 whether the other of said two switching devices is welded closed. If so, the first signal is removed from the one switching device at step 106. For example, if the annunciation was sensed by sensing device 18, microprocessor 12 removes the first signal from first switching device 14, causing the first switching device 14 to open. Because this causes power to be removed from the output load, the main load stops operating.

Figure 3:
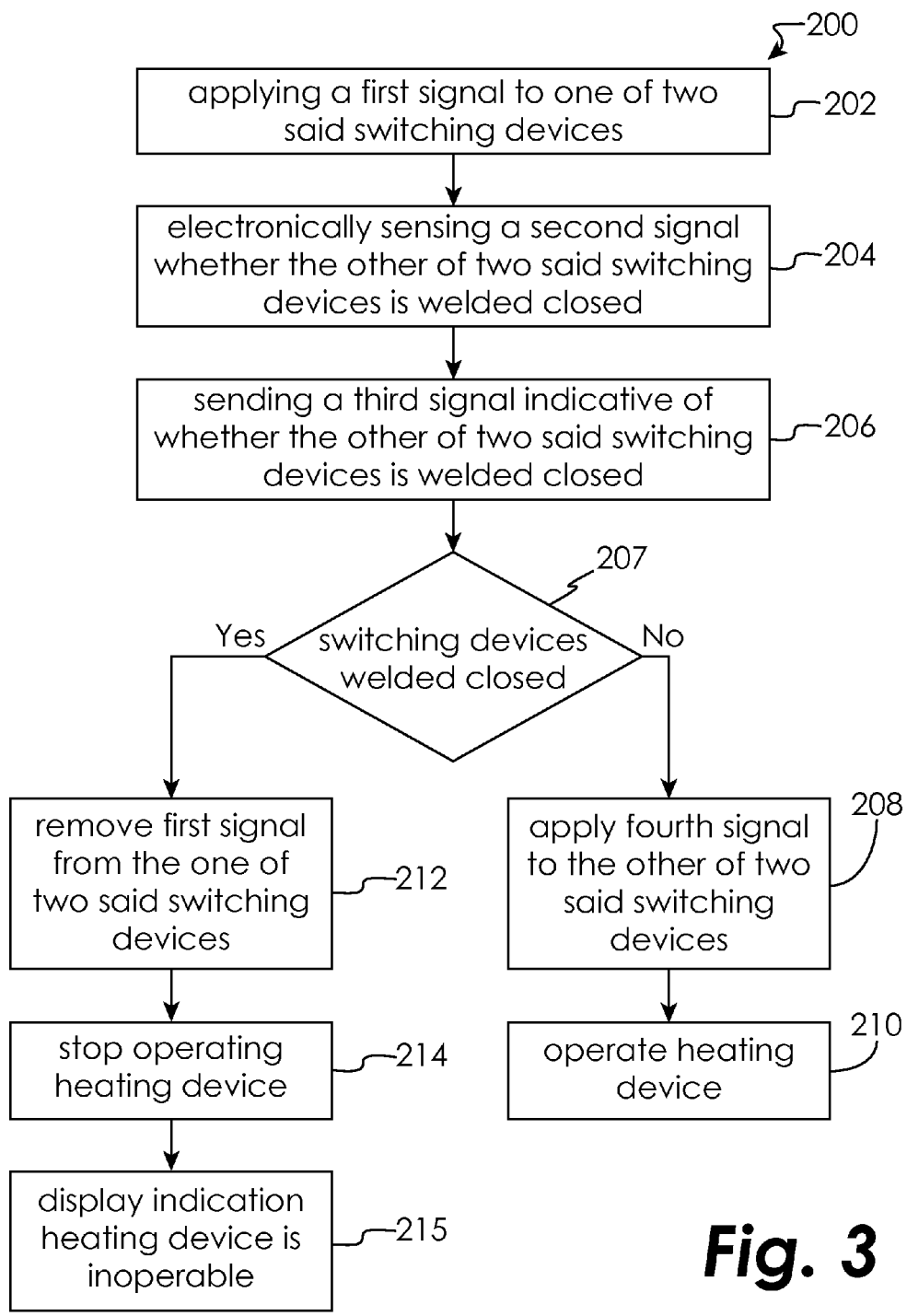
FIG. 3 is a schematic flow chart of another embodiment of a method for detecting a welded switching device.

FIG. 3 illustrates another embodiment of a method for detecting a single welded switching device in the circuit 10 of FIG. 1. As shown in FIG. 3, an embodiment of the method 200 includes the step 202 of applying a first signal to one of two said switching devices. In one embodiment, the first signal operates to close the one switching device In various embodiments, the one switching device may be the first switching device 14 or the second switching device 16. For example, it may be desirable to alternate between applying the first signal to the first switching device 14 and the second switching device 16 to extend the life of the switching devices by distributing the wear between the first switching device 14 and the second switching device 16.

In one embodiment, step 204 includes electronically sensing with the sensing device 18 a second signal indicative of whether the other of said two switching devices is welded closed. In various embodiments, the other of said two switching devices may be the first switching device 14 or the second switching device 16. In one embodiment, the sensing device 18 senses whether the other of said two switching devices may be welded closed by the detecting the second signal from the electrical element 24. In one embodiment, the sensing device 18 may be an optocoupler. In one embodiment, the electrical element 24 may be a light emitting diode.

In one embodiment, step 206 includes sending a third signal from the sensing device 18 to the microprocessor 12 indicative of whether the other of said two switching devices is welded closed.

In one embodiment, it is decided at step 207 if the other of said two switching devices is not welded closed. If so, a fourth signal is applied to the other of two said switching devices at step 208. In one embodiment, the fourth signal is an electrical signal, commanded by the microprocessor 12, to close the other of two said switching devices. For example, if sensing device 18 indicated that the second switching device 16 was not welded closed, microprocessor 12 sends an electrical signal commanding the second switching device 16 to close. Once the first switching device 14 and the second switching device 16 are closed, power is applied to the output load (not shown), which proceeds with normal operation at step 210. In some embodiments, the output load comprises a HVAC device (not shown) in a HVAC system. The output load may be electrical heating elements within an electric boiler to name one non-limiting example.

In another embodiment, it is decided at step 207 if the other of said two switching devices is welded closed. If so, the first signal is removed from the one switching device at step 212. For example, microprocessor 12 removes the first signal from first switching device 14, causing the first switching device 14 to open. Because this causes power to be removed from the output load, the main load stops operating at step 214. Optionally, step 216 may cause displaying of an indication that the output load is inoperable, such as by illuminating a warning light to name just one non-limiting example.

Figure 4:
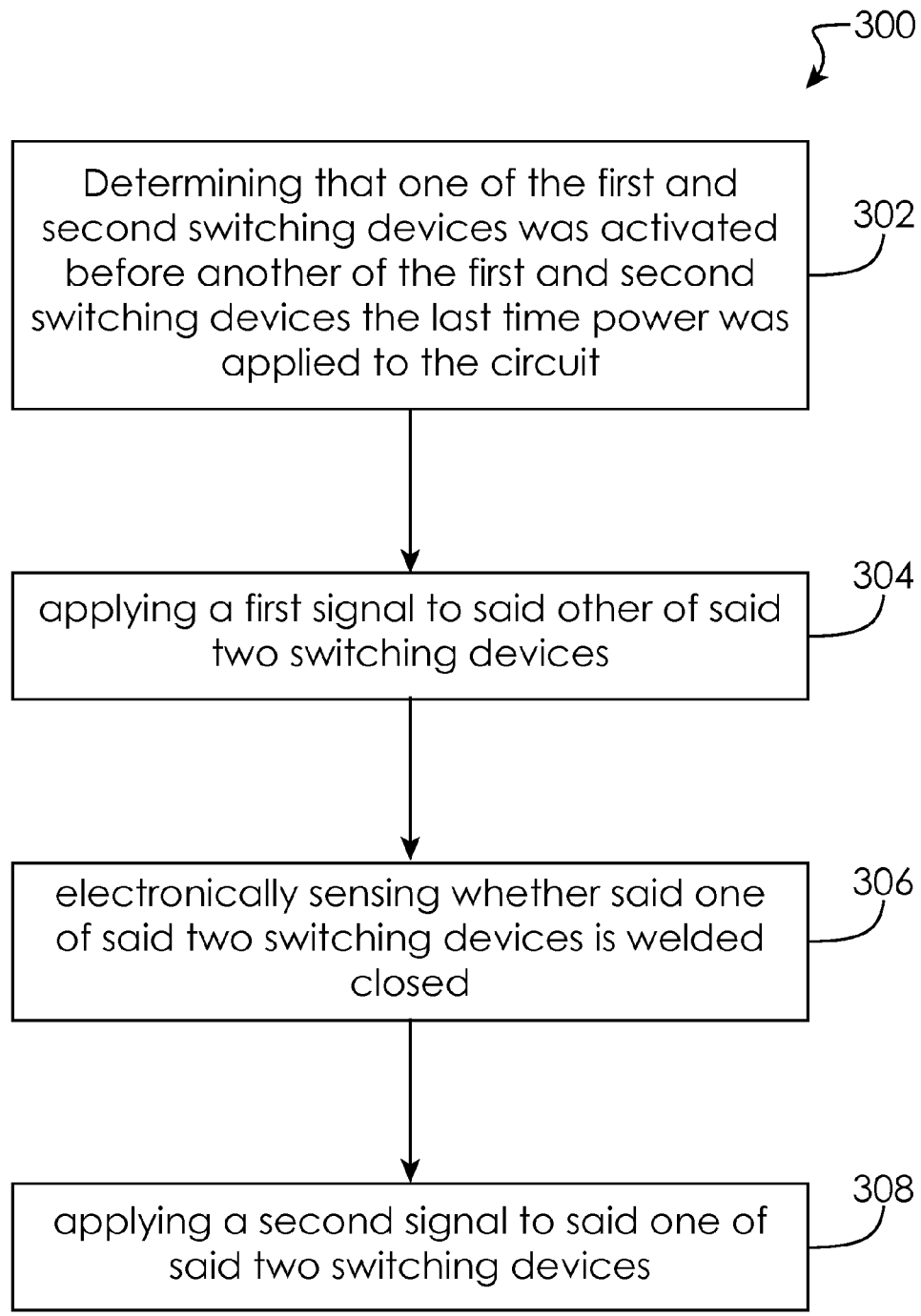
FIG. 4 is a schematic flow chart of another embodiment of a method for detecting a welded switching device.

FIG. 4 illustrates another embodiment of a method for detecting a single welded switching device in the circuit 10 of FIG. 1. As shown in FIG. 4, an embodiment of the method 300 includes the step 302 of determining that one of the first switching device 14 and second switching device 16 was activated before another of the first switching device 14 and second switching device 16 the last time power was applied to the circuit. For example, microprocessor 12 determines whether the first switching device 14 was commanded to activate before the second switching device 16 during the last time power was supplied to the circuit. If it is determined that the first switching device 14 was activated before the second switching device 16, the microprocessor 12 activate the second switching device 16 before the first switching device 14 the next time power is applied to the circuit.

In one embodiment, step 304 includes applying a first signal to said other of said two switching devices. In one embodiment, the first signal operates to close said other of said two switching devices. In one embodiment, step 306 includes electronically sensing with the sensing device 18 whether said one of said two switching devices is welded closed. In one embodiment, step 308 includes applying a second signal to said one of said two switching devices. In one embodiment, the second signal operates to close said one of said two switching devices.

It will be appreciated that, as the first switching device 14 is closed, a voltage is applied to the electrical element 24. If the electrical element 24 produces a second signal that is sensed by the sensing device 18, it can be deduced that the second switching device 16 is welded closed, thereby allowing a current to flow from the power line, through the first switching device 14, through the electrical element 24, through the second switching device 16, and to the power neutral. It will also be appreciated that the second switching device 16 may be commanded to close first to determine if the first switching device 14 has welded closed. Therefore, it may be determined after at least two cycles whether either the first switching device 14 or the second switching device 16 has welded closed to prevent unintended operation of the output load (not shown). It will be further appreciated that if normally closed switching devices are used, an analogous system and method may be used by commanding one of the switching devices to open.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A method of sensing a welded closed switching device contact in one of and between two switching devices, the method comprising the steps of:
   (a) breaking both sides of a power line on a HVAC device;
   (b) applying a first signal to one but not both of said two switching devices;
   (c) electronically sensing with a sensing device a second signal indicative of whether the other of said two switching devices is welded closed; and
   (d) sending a third signal from the sensing device to a microprocessor indicative of whether the other of said two switching devices is welded closed.

2. The method of 1, wherein the first signal operates to close the one switching device.

3. The method of claim 1, further comprising the step of:
   (d) removing said first signal from the one switching device if the second signal indicates that the other switching device is welded closed.

4. The method of claim 1, further comprising the step of:
   (e) applying a fourth signal to the other of said two switching devices if the second signal indicates that the other switching device is not welded closed.

5. The method of claim 4, wherein the fourth signal operates to close the other of two said switching devices.

6. The method of claim 1, wherein the one switching device comprises a switching device selected from the group consisting of: the first switching device and the second switching device.

7. The method of claim 1, wherein the other switching device comprises a switching device selected from the group consisting of: the first switching device and the second switching device.

8. The method of claim 1, wherein the sensing device electronically senses whether the other switching device is welded closed by detecting the second signal from the electrical element.

9. The method of claim 8, wherein the sensing device comprises an optocoupler.

10. The method of claim 1, wherein the HVAC device comprises:
    a control comprising the microprocessor;
    said two switching devices comprising a first switching device and a second switching device in electrical communication with the control;
    wherein the sensing device is in electrical communication with the control; and
    an electrical element in electrical communication with the sensing device.

\* \* \* \* \*